United States Patent [19]
Egami et al.

[11] Patent Number: 5,933,129
[45] Date of Patent: Aug. 3, 1999

[54] SIGNAL WAVEFORM DISPLAY SYSTEM

[75] Inventors: Haruhisa Egami; Tohru Furuse, both of Kanagawa-ken, Japan

[73] Assignee: Leader Electronics Corp., Japan

[21] Appl. No.: 08/864,077

[22] Filed: May 28, 1997

[30] Foreign Application Priority Data

May 31, 1996 [JP] Japan .................................... 8-139143

[51] Int. Cl.⁶ ...................................................... G09G 5/36
[52] U.S. Cl. .......................................... 345/134; 348/184
[58] Field of Search .................................... 345/134, 440; 348/185, 184

[56] References Cited

U.S. PATENT DOCUMENTS

| | | | |
|---|---|---|---|
| 3,857,059 | 12/1974 | Larson | 315/391 |
| 4,677,481 | 6/1987 | Nicholas | 348/184 |
| 4,731,586 | 3/1988 | Perkins | 324/536 |
| 5,526,042 | 6/1996 | Ozawa et al. | 348/185 |

FOREIGN PATENT DOCUMENTS

| | | |
|---|---|---|
| 45-35591 | 11/1970 | Japan . |
| 49-22173 | 2/1974 | Japan . |
| 50-62669 | 5/1975 | Japan . |
| 50-143577 | 11/1975 | Japan . |
| 53-46064 | 4/1978 | Japan . |

*Primary Examiner*—Mark R. Powell
*Assistant Examiner*—Thu Nguyen
*Attorney, Agent, or Firm*—Fish & Richardson PC

[57] ABSTRACT

A signal waveform display system for displaying waveforms of one or two input signals on a display screen is provided which comprises first–third input switching circuits, first and second trigger generators, first and second horizontal sweep generators, and a composite horizontal sweet generator. The trigger generators respectively generates first and second trigger pulses synchronously with the input signals provided thereto through the first and second input switching circuits. The sweep generators are triggered by the trigger pulses and generate first and second sweep signals having variable time periods, respectively. The composite sweep generator generates a composite sweep signal including lower portions of the first sweep signal which are smaller than a reference voltage, and upper portions of the second sweep signal which are higher than the reference voltage. The input signals are selectively provided to a vertical axis driving circuit, and the composite sweep signal is provided to a horizontal axis driving circuit, thereby the waveforms on different time scales can be laterally displayed on the screen.

7 Claims, 5 Drawing Sheets

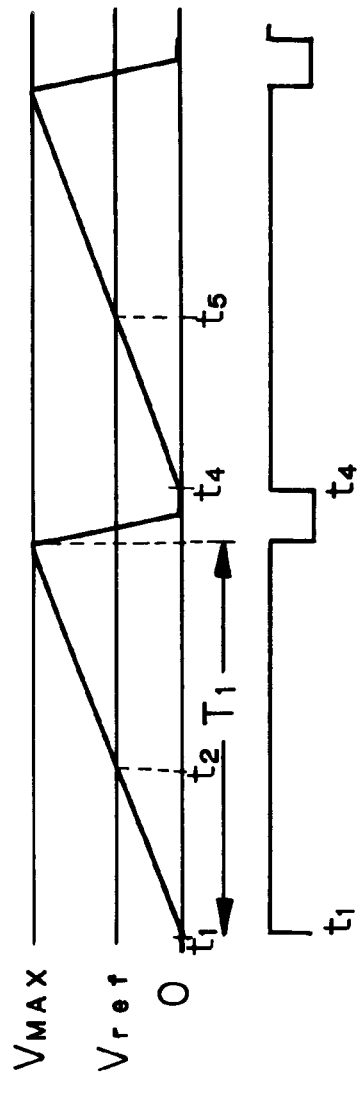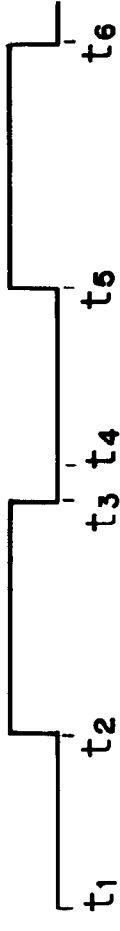
Fig. 3A  Fig. 3B  Fig. 3C  Fig. 3D  Fig. 3E

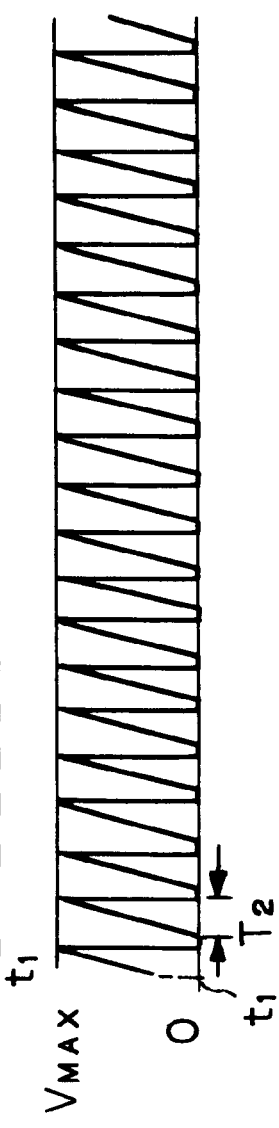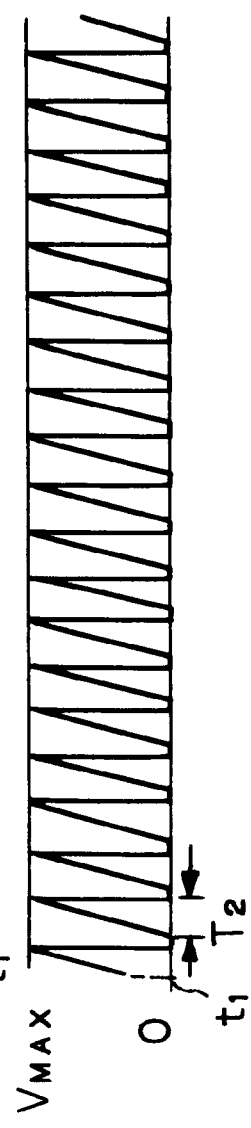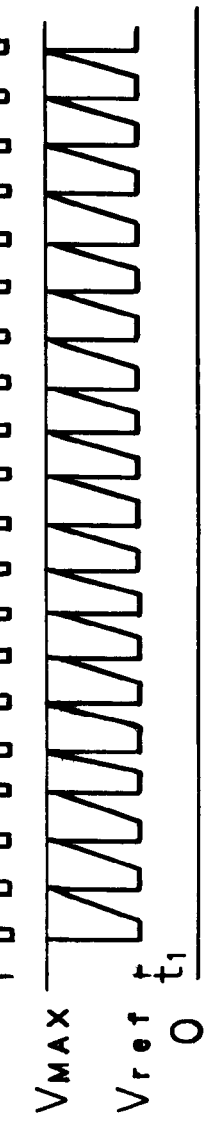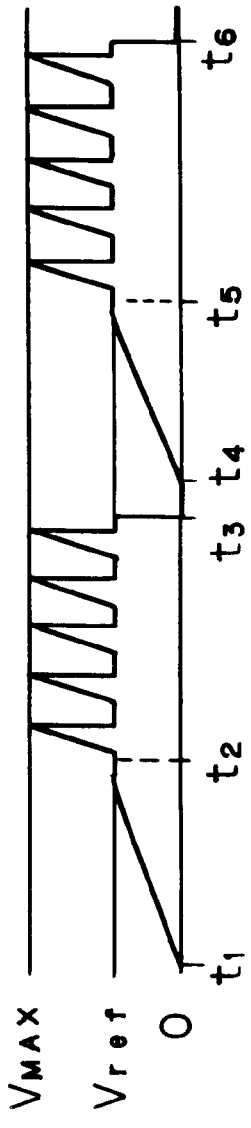
Fig. 3F  
Fig. 3G  
Fig. 3H  
Fig. 3I  
Fig. 3J

SIGNAL WAVEFORM DISPLAY SYSTEM

BACKGROUND OF THE INVENTION

The present invention relates generally to a signal waveform display system such as an oscilloscope, for displaying waveforms of input signals, and more particularly to a signal waveform display system which can laterally display signal waveforms on two different time scales side by side on the same screen.

In a conventional oscilloscope, when a display mode is set to a delay sweep mode, a portion of an entire signal waveform displayed on a screen is enlarged in the time axis direction. Either of the entire waveform or the enlarged partial waveform is selectively displayed on the screen, or the two different waveforms of the same signal are displayed simultaneously on two vertically split screen areas, as illustrated in FIG. 1.

Also, when a plurality of different signal waveforms are to be displayed, a plurality of oscilloscopes are provided to display the respective signal waveforms.

While the prior oscilloscope as mentioned above can employ the delay sweep mode to split the screen into two upper and lower areas for simultaneously displaying waveforms of a single signal on two different time axis scales, the delay sweep mode requires a high speed sweep for displaying temporally small portions of a signal in an enlarged view. However, a shorter sweep time period due to the high speed sweep results in a waveform displayed on the screen (for example, the waveform displayed on the lower screen area in FIG. 1) with a lower luminance.

Another problem with the prior art oscilloscope which may arise when two waveforms displayed on a single screen have large amplitudes, will overlap with each other to cause difficulties in viewing the two displayed waveforms. Although two waveforms may be controlled to selectively display them to prevent their displayed waveforms from overlapping, an operator is required to memorize a displayed signal waveform before a switching operation. If the operator cannot properly remember the waveform state before the switching operation was effected, the display must again be switched to the previous display state for confirmation. Thus, the alternate display involves complicated operations as well as requiring an operator to exactly memorize switched waveforms.

Further, when waveforms of a plurality of different signals should be compared with each other, they are displayed respectively on different oscilloscopes, the comparison of the waveforms is quite difficult to achieve because a waveform displayed on an oscilloscope must be compared with another waveform on another oscilloscope.

SUMMARY OF THE INVENTION

It is a first object of the present invention to eliminate such problems inherent to prior arts as mentioned above, and to provide a signal waveform display system which is capable of laterally displaying, on the same display screen, two waveforms associated with the same input signal of two different time scales, without degrading the luminance of a waveform displayed in enlarged view.

It is a second object of the present invention to provide a signal waveform display system which is capable of laterally displaying waveforms of two different input signals to facilitate a comparison between the two waveforms as well as substantially independently setting the time scales for the two waveforms.

To achieve the first object, a signal waveform display system for displaying waveforms of input signals on a display screen according to the present invention comprises:

(a) first trigger generating means for generating a first trigger pulse synchronously with a signal provided thereto;

(b) a first horizontal sweep generating means which is triggered by said first trigger pulse, for generating a first sweep signal having a first adjustable period;

(c) second trigger generating means for generating a second trigger pulse synchronously with a signal provided thereto;

(d) second horizontal sweep generating means which is trigger by said second trigger pulse, for generating a second sweep signal having a second adjustable period; and (e) composite horizontal sweep generating means for generating a composite sweep signal to a horizontal axis driving means, said composite sweep signal including lower portions of said first sweep signal which are smaller than a reference voltage, and upper portions of said second sweep signal which are larger than said reference voltage, whereby it is capable of laterally displaying the waveforms of different time scales on the same screen.

In an embodiment of the system according to the present invention, the composite horizontal sweep generating means includes: variable reference voltage generating means for generating said reference voltage; comparing means for comparing said reference voltage with said first sweep signal to output a switching control signal; clipping means for lower-clipping said second sweep signal at said reference voltage to provide the upper portions thereof; and sweep switching means responsive to said switching control signal, for selecting said first sweep signal when said first sweep signal is smaller than said reference voltage, and otherwise for selecting the clipped second sweep signal, to provide said composite sweep signal.

In order to achieve the second purpose of the present invention, the above signal waveform display system further comprises: a first input switching means for selectively transferring first and second input signals of said system to said first trigger generating means; a second input switching means for selectively transferring said first and second input signals of said system to said second trigger generating means; and a third input switching means for selectively transferring said first and second input signals of said system to a vertical axis driving circuit, in response to said switching control signal from said comparator means, whereby it is capable of laterally displaying the waveforms of the first and second input signals of different time scales on the same screen.

In order to laterally display different time scale waveforms of only one of the first and second input signals in the system having the third input switching means, the system further includes means for preventing the switching control signal from being provided to the third input switching means, not to change a connection state thereof. Further, in order to display the waveform of only one of the first and second input signals, the system further comprises means for preventing said switching control signal from being provided to said sweep switching means, not to change a connection state thereof.

BRIEF DESCRIPTION OF THE DRAWINGS

FIGS. 3A–3J show waveforms of signals outputted from components of the embodiment illustrated in FIG. 2;

DESCRIPTION OF THE PREFERRED EMBODIMENTS

Figure 1:
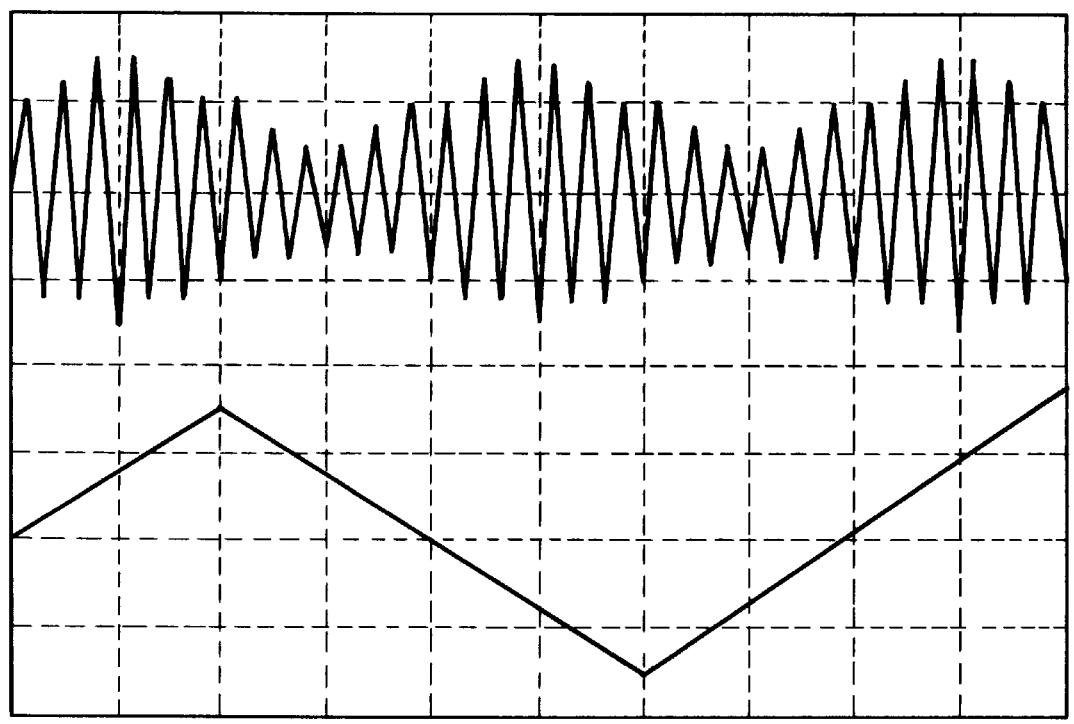
FIG. 1 is an explanatory diagram schematically illustrating signal waveforms displayed on a screen of a prior art signal waveform display apparatus.
Figure 2:
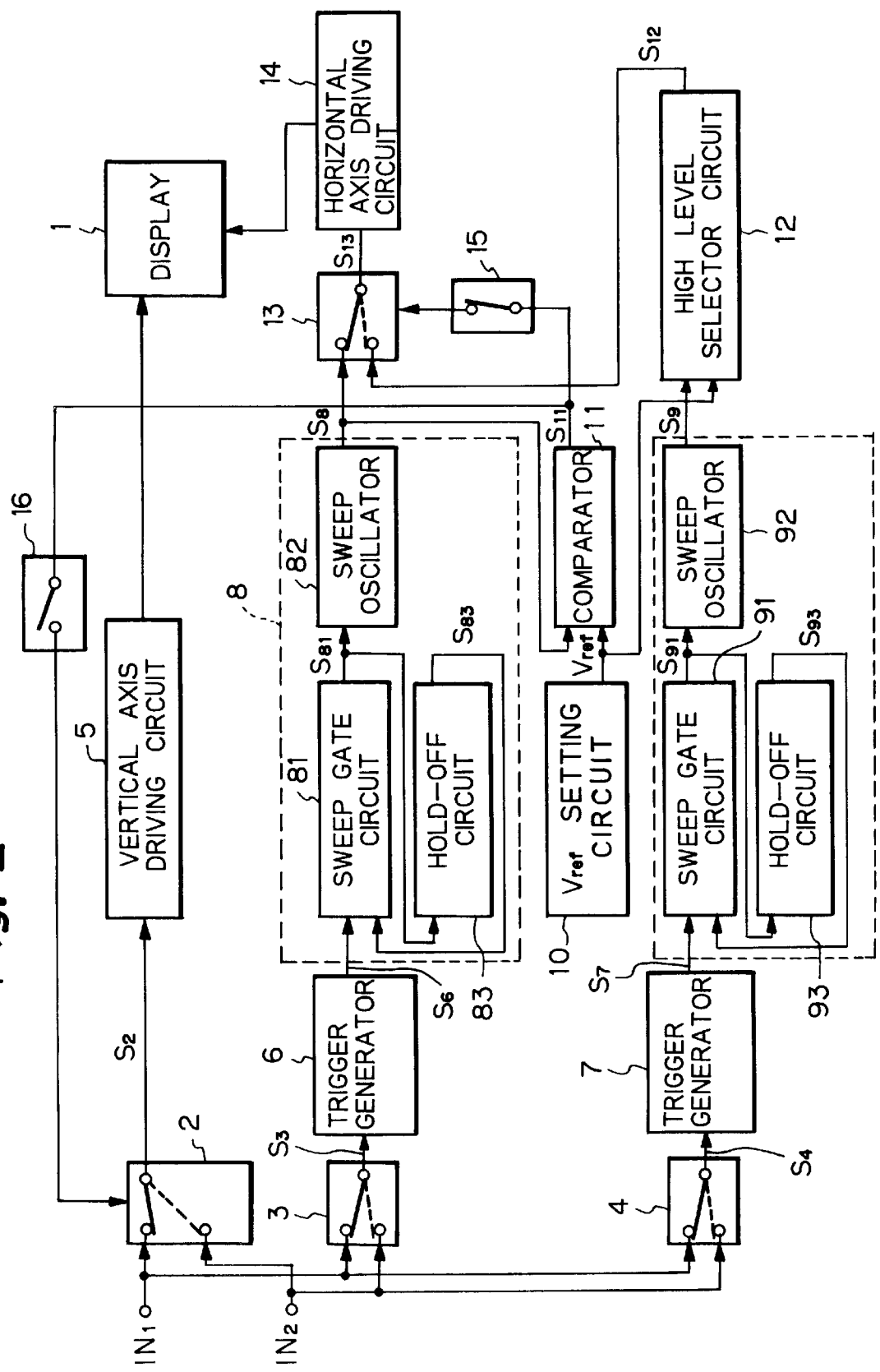
FIG. 2 is a block diagram illustrating an embodiment of a signal waveform display system according to the present invention.

FIG. 2 illustrates a signal waveform display system according to an embodiment of the present invention. Referring to FIG. 2, the signal waveform display apparatus comprises a display 1, such as a CRT display or the like, for displaying waveforms of input signals, Input switching circuits 2–4 for respectively selecting Input signals IN1, IN2, a vertical axis driving circuit 5, first and second trigger generators 6, 7, first and second horizontal sweep generators 8, 9, and a variable reference voltage setting circuit 10 for generating a reference voltage Vref. The apparatus further includes a comparator 11 for comparing an output of the first horizontal sweep generator 8 with the reference voltage Vref, a high level selector circuit 12 for selecting the higher level portions of an output of the second horizontal sweep generator 9 and the reference voltage Vref, a sweep switching circuit 13 for selectively outputting outputs of the first horizontal sweep generator 8 and the high level selector circuit 12, a horizontal axis driving circuit 14, and switching circuits 15, 16 for presetting whether or not operations of the sweep switching circuit 13 and the input switching circuit 2 are controlled in response to an output of the comparator 11.

The input signals IN1, IN2 are respectively supplied to the input switching circuits 2–4 through associated variable gain input amplifiers (not shown). It should be also no ted that an operation of the entire apparatus is controlled by control signals from a control circuit such as a CPU, though the control circuit and the control signals are omitted in FIG. 2.

The input signal IN1 or IN2 selected by the Input switching circuit 2 is supplied as a signal S2 to the vertical axis driving circuit 5 which drives the vertical axis of the display 1 in response to an amplitude of the signal S2. On the other hand, the input signal IN1 or IN2 selected by the input switching circuits 3, 4 is supplied as signals S3, S4 to the first and second trigger generators 6, 7, respectively, which output trigger pulses S6, S7 in synchronism with the signals S3, S4 supplied thereto. The first and second horizontal sweep generators 8, 9 are triggered by the generated trigger pulses S6, S7 to generate first and second sweep signals S8, S9 having variable time period, respectively.

The second sweep signal S9 is compared with the reference voltage Vref outputted from the reference voltage setting circuit 10 at the high level selector circuit 12, and the higher portions are outputted as a signal S12 therefrom. That is, the signal S12 is constituted with portions of the second sweep signal S9 higher than the reference voltage Vref multiplexed on the reference voltage Vref. In other wards, the high level selector circuit is a clipper circuit which clips or limits a lower level of the second sweep signal at the reference voltage Vref. The signal S12 (or, the clipped second sweep signal) is provided to the sweep switching circuit 13, which also receives the first sweep signal S8.

The first sweep signal S8 is also supplied to the comparator 11 to be compared with the reference voltage Vref from the reference voltage setting circuit 10. The comparator 11 supplies a signal representative of a magnitude relationship therebetween thorough the switching circuit S15 to the sweep switching circuit 13 as a switching control signal S11. When the switching circuit 15 is set on, the sweep switching circuit 13 selectively outputs either of the first sweep signal S8 and the level shift sweep signal S12 in accordance with the switching control signal S11, and supplies the selected signal (S8 or S12) to the horizontal axis driving circuit 14 as a composite sweep signal S13. The switching control signal S11 is also supplied to the input switching circuit 2 through the switching circuit 16.

The first horizontal sweep generator 8, which comprises a sweep gate circuit 81, a sweep oscillator 82, and a hold-off circuit 83, serves as a general-purpose horizontal sweep generator for generating a voltage which sweeps in a range from zero to VMAX corresponding to the horizontal axis of the display 1. The second horizontal sweep generator 9, which comprises a sweep gate circuit 91, a sweep oscillator 92, and a hold-off circuit 93, in a manner similar to the first horizontal sweep generator 8, also serves as a general-purpose horizontal sweep generator for generating a sweep voltage in the range of zero to VMAX. The reference voltage setting circuit 10 is configured to provide the reference voltage Vref which is variable in the range of zero to VMAX.

Next, the operation of the signal waveform display apparatus illustrated in FIG. 2 will be described in detail.

Described first is the case where the input signal IN1 only is fetched into the signal waveform display apparatus and two waveforms thereof on different time scales are displayed on laterally split screen areas of the display 1.

The input switching circuits 2–4 are preset, under a control of the non-illustrated control circuit, to be connected to the input signal IN1 side (as indicated by solid lines in FIG. 2), and the sweep switching circuit 13 is preset to be connected to the first horizontal sweep generator 8 (as indicated by a solid line in FIG. 2). Also, the switching circuit 15 is preset to the ON state so that the sweep switching circuit 13 is switched depending on the switching control signal S11 from the comparator 11. The switching circuit 16, in turn, is preset to a OFF state so that the input switching circuit 2 does not depend on the switching control signal S11.

When the input signal IN1 as illustrated in FIG. 3A is inputted in the apparatus, it is supplied to the vertical axis driving circuit 5 through the input switching circuit 2 as the signal S2 (or, S2=IN1). The input signal IN1 is also supplied to the first and second trigger generators 6, 7 through the input switching circuits 3, 4, respectively. The first and second trigger circuits 6, 7 generate the first and second trigger pulses S6, S7, as illustrated in FIG. 3B and 3F, respectively. It should be noted that while the first and second trigger pulses S6, S7 are synchronized with the input signal IN1, they can be independently generated at different timings from each other. FIGS. 3B and 3F illustrate exemplary setting in which the first trigger pulse S6 rises from a logical low level to a logical high level at the time the input signal IN1 reaches a zero level, while the second trigger signal S7 rises at the time the input signal IN1 reaches a predetermined negative level.

The trigger pulses S6, S7 are supplied to the sweep oscillators 82, 92 through the sweep gate circuits 81, 91 in the first and second horizontal sweep generators 8, 9, respectively, and the sweep oscillators 82, 92 are triggered, for example, at rising edges of the trigger pulses S6, S7, respectively.

The sweep oscillators 82, 92 are constituted to generate sweep signals, which become the first and second sweep signals S8, S9, having different periods from each other. For example, as illustrated in FIGS. 3C and 3G, the first and second sweep signals S8, S9 have different periods T1, T2. The sweep gate circuits 81, 91 are constituted to generate signals S81, S91 having the same periods as the first and second sweep signals S8, S9, as illustrated in FIGS. 3D and 3H, respectively. The hold-off circuits 83, 93 prevent the sweep oscillators 82, 92 from being triggered again by the trigger pulses incoming thereto during a transition period from the time the first and second sweep signals S8, S9 reach the maximum amplitude value VMAX to the time they return to the zero level.

The first sweep signal S8 from the first horizontal sweep generator 8 is supplied to the sweep switching circuit 13 as well as to the comparator 11. The comparator 11 compares the first sweep signal S8 with the reference voltage Vref, and outputs the switching control signal S11 (see FIG. 3E) which goes high when the first sweep signal S8 is larger than the reference voltage Vref. The switching control signal S11 is supplied to the sweep switching circuit 13 to switch it.

The second sweep signal S9 from the second horizontal sweep generator 9 has been clipped at the reference voltage Vref from the reference voltage setting circuit 10 to become the clipped second sweep signal S12, at the high level selector circuit 12. The clipped second sweep signal S12 is illustrated in FIG. 3I. In other words, the level shift sweep signal S12 is formed by the higher level portions of the second sweep signal S9 and the reference voltage Vref added thereto. The clipped second sweep signal S12 is supplied to the sweep switching circuit 13.

The sweep switching circuit 13 outputs the first sweep signal S8 during low level periods of the switch control signal S11, while its connection state is responsively switched to output the clipped second sweep signal S12 when the switching control signal S11 is inverted to a high level, thereby generating the composite sweep signal S13 from the sweep switching circuit 13, as illustrated in FIG. 3H.

When the composite sweep signal S13 is supplied to the horizontal axis driving circuit 14, the display 1 displays the waveform of the input signal IN1 on a first time scale corresponding to the first sweep signal S8 during time periods t1–t2 and t4–t5, and that on a second time scale corresponding to the clipped second sweep signal S12 during time periods t2–t3 and t5–t6.

Figure 4:
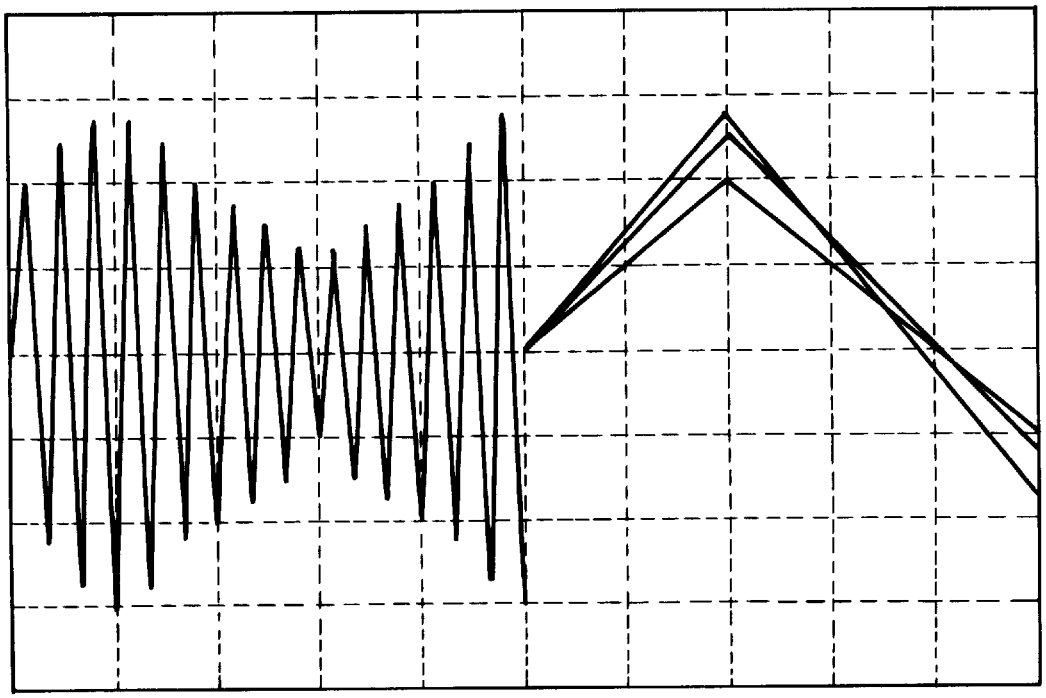
FIG. 4 is an explanatory diagram schematically illustrating signal waveforms displayed on a screen in accordance with the present invention.

Thus, as illustrated in FIG. 4, the signal waveforms of the input signal IN1 on different time scales (or different time axes) can be displayed on two laterally split screen areas, i.e., on left and right screen areas of the display 1, respectively.

Next, an operation of the apparatus in the case that two different input signals IN1, IN2 are to be displayed on the laterally split screen areas will be explained. Assuming that the input signals IN1 and IN2 are displayed on the left and right screen areas, the input switching circuits 2, 3 are preset to be connected to the input signal IN1 sides, the input signal switch 4 is preset to be connected to the input signal IN2 side, and the sweep switching circuit 13 is preset to be connected to the output of the first horizontal sweep generator 8. In addition, the switch circuits 15, 16 are both held in ON state, so that the sweep switching circuit 13 and the input switching circuit 2 are controlled to be switched in synchronism with each other, by the switching control signal S11 from the comparator 11.

Conversely, for displaying the input signal IN1 on the right screen area and the input signal IN2 on the left screen area, the input switching circuits 2, 3 are preset to be connected to the input signal IN2 sides and the input switching circuit 4 to the input signal IN1 side. Also in this case, the sweep switching circuit 13 is preset to be connected to the horizontal sweep generator 8, and the switching circuits 15, 16 are held in ON state.

Further, when the first input signal IN1 only is displayed on the entire display screen on a single time scale, the input switching circuits 2, 3 are connected to the input signal IN1 sides, the sweep switching circuit 13 are connected to the first horizontal sweep generator 8, and the switching circuits 15, 16 are held in OFF state. On the other hand, when the second input signal IN2 only is displayed on the entire display screen on a single time scale, the input switching circuits 2, 3 are connected to the input signal IN2 sides. The sweep switching circuit 13 is likewise connected to the first horizontal sweep generator 8, and the switching circuits 15, 16 are both held in OFF state.

In the signal waveform display apparatus illustrated in FIG. 2, since the level of the reference voltage Vref generated from the reference voltage setting circuit 10 can be adjusted to change the transition timing of the switching control signal S11 to the high level, the switching timing of the sweep switching circuit 13 (and the input switching circuit 2) can be adjusted, thereby adjusting a lateral or horizontal position at which the screen is split.

Also, it should be noted that the time scales of displayed waveforms on the respective split screen areas can be changed by arbitrarily adjusting the periods T1, T2 of the sweep signals S8, S9 outputted from the sweep oscillators 82, 92.

Figure 5:
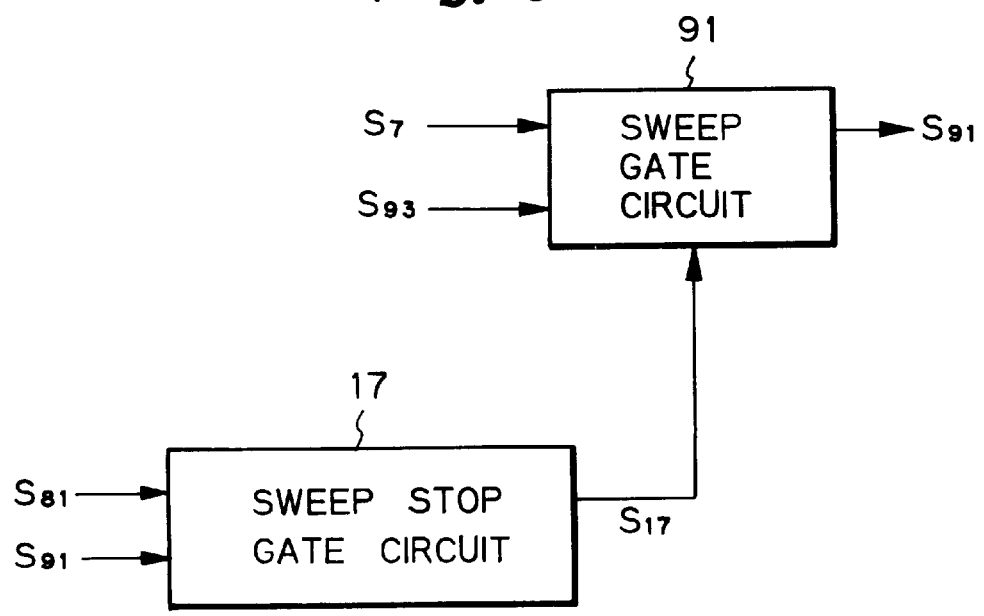
FIG. 5 is a block diagram for explaining a second embodiment of the present invention.

Since the periods T1, T2 of the sweep signals S8, S9 from the sweep oscillators 82, 92 are variable, the composite sweep signal S13 may occasionally lower to the zero level before it reaches the maximum amplitude VMAX in some cases. If the composite sweep signal S13 must not return to the zero level from a middle amplitude less than the maximum amplitude VMAX, a sweep stop gate circuit 17 may be provided as illustrated in FIG. 5. The sweep stop gate circuit 17 receives the signals S81, S91 from the sweep gate circuits 81, 91 and provides an output S17 for controlling the sweep gate circuit 91, to prevent the sweep switching circuit 13 from being switched to be connected to the first sweep generator 83 until the composite sweep signal S13 reaches the zero level. The sweep stop gate circuit 17 comprises two inverter circuits for inverting the signals S81, S91 and a NAND gate for performing a logical NAND operation for outputs of these inverters, and an output of the NAND gate is supplied to the sweep gate circuit 91 as the control signal S17.

A variety of modifications may be made to the embodiments illustrated in FIGS. 2 and 4. For example, although the high level selector circuit 12 is positioned at the stage subsequent to the second horizontal sweep generator circuit 9 in the embodiment of FIG. 2, the circuit 12 may be positioned between the sweep switching circuit 13 and the horizontal axis driving circuit 14. In this case, the high level selector circuit 12 must be controlled to operate only when the switching control signal S11 from the comparator 11 is at a high level.

Also, the sweep switching circuit 13 may be controlled to be switched to the first horizontal sweep generator 8 at the end of the first sweep signal S8, i.e., at time t3, t6 at which the first sweep signal S8 reaches the maximum value.

Further, the input switching circuits 2–4 and the switching circuit 16 may be removed if waveforms of a plurality of input signals need not be displayed simultaneously on the laterally split screen areas. Additionally in this case, the trigger generator 7 may also be removed if the generating timing of the first and second trigger pulses S6, S7 need not be independently adjusted, in which case the second horizontal sweep generator 9 may be supplied with the trigger pulse S6 generated by the first trigger generator 6.

Furthermore, if the reference voltage setting circuit 10 is modified to generate two or more reference voltages and three or more sweep signal generation circuits are employed, three or more signal waveforms on independent time scales can be displayed on laterally split screen areas in parallel.

According to the present invention as described above, since signal waveforms on different time axis scales can be displayed on left and right portions of the same display screen, the waveforms can be displayed without overlapping even if the signal waveforms have large amplitudes. Further, since the display apparatus of the present invention can display not only waveforms of the same input signal but also waveforms of a plurality of different input signals simultaneously on the same screen, the displayed waveforms can be compared on the same screen for confirming a mutual relationship therebetween without any complicated operation, thereby facilitating the detection of noise or the like on the signals.

In addition, since the display apparatus of the present invention does not employ a high speed sweep as does the prior art example in the delay sweep mode for displaying two waveforms, the luminance will not be reduced even in an enlarged display on the screen.

While the preferred forms of the present invention has been described, it is to be understood that modifications will be apparent to those skilled in the art without departing from the spirit of the invention.

What is claimed is:

1. A signal waveform display system for displaying waveforms of input signals on a display screen, comprising:
   (a) a first trigger generator for generating a first trigger pulse synchronously with a signal provided thereto;
   (b) a first horizontal sweep generator triggered by said first trigger pulse and generating a first sweep signal having a first adjustable period in response to the first trigger pulse;
   (c) a second trigger generator for generating a second trigger pulse synchronously with a signal provided thereto;
   (d) a second horizontal sweep generator triggered by said second trigger pulse and generating a second sweep signal having a second adjustable period in response to the second trigger pulse; and
   (e) a composite horizontal sweep generator for generating a composite sweep signal to a horizontal axis driving means, said composite sweep signal including lower portions of said first sweep signal which are smaller than a reference voltage, and upper portions of said second sweep signal which are larger than said reference voltage, whereby the system is capable of laterally displaying the waveforms of different time scales on the same screen.

2. A signal waveform display system according to claim 1, wherein said composite horizontal sweep generator includes:
   variable reference voltage generating means for generating said reference voltage;
   comparing means for comparing said reference voltage with said first sweep signal to output a switching control signal;
   clipping means for lower-clipping said second sweep signal at said reference voltage to provide the upper portions thereof; and
   sweep switching means responsive to said switching control signal, for selecting said first sweep signal when said first sweep signal is smaller than said reference voltage, and otherwise for selecting the clipped second sweep signal, to provide said composite sweep signal.

3. A signal waveform display system according to claim 1, wherein said signals respectively provided to said first and second trigger generators are the same input signal of said system.

4. A signal waveform display system according to claim 2, further comprising:
   a first input switch for selectively transferring first and second input signals of said system to said first trigger generator;
   a second input switch for selectively transferring said first and second input signals of said system to said second trigger generator; and a third input switch for selectively transferring said first and second input signals of said system to a vertical axis driving circuit, in response to said switching control signal from said comparator means, whereby the system is capable of laterally displaying the waveforms of the first and second input signals of different time scales on the same screen.

5. A signal waveform display system according to claim 4, further comprising:
   means for preventing said switching control signal from being provided to said third input switch, so as not to change a connection state thereof when laterally displaying the waveforms of only one of said first and second input signals of different time scales.

6. A signal waveform display system according to claim 5, further comprising:
   means for preventing said switching control signal from being provided to said sweep switching means, so as not to change a connection state thereof when displaying the waveform of only one of said first and second input signals of a time scale.

7. A signal waveform display system according to claim 2, wherein said first period of said first sweep signal is set to be longer than said second period of said second sweep signal, and said composite horizontal sweep generator further comprises means for controlling said sweep switching means not to transfer said first sweep signal until said first sweep signal reaches a maximum level.

* * * * *